(12) United States Patent
He et al.

(10) Patent No.: US 12,382,574 B2
(45) Date of Patent: Aug. 5, 2025

(54) ELECTRONIC ELEMENT, CIRCUIT BOARD WITH ELECTRONIC ELEMENT, AND ELECTRONIC DEVICE

(71) Applicant: HUAWEI TECHNOLOGIES CO., LTD., Shenzhen (CN)

(72) Inventors: Chenyang He, Shanghai (CN); Ruiming Mo, Shanghai (CN); Jie Sun, Shanghai (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 145 days.

(21) Appl. No.: 17/837,445

(22) Filed: Jun. 10, 2022

(65) Prior Publication Data
US 2022/0304138 A1    Sep. 22, 2022

Related U.S. Application Data

(63) Continuation of application No. PCT/CN2019/125365, filed on Dec. 13, 2019.

(51) Int. Cl.
H05K 1/02    (2006.01)
H05K 1/11    (2006.01)
H05K 1/18    (2006.01)

(52) U.S. Cl.
CPC ......... *H05K 1/0203* (2013.01); *H05K 1/0213* (2013.01); *H05K 1/111* (2013.01); *H05K 1/181* (2013.01); *H05K 2201/09036* (2013.01)

(58) Field of Classification Search
CPC ............... H01L 24/48; H01L 2924/181; H01L 2224/48247; H01L 25/0657;
(Continued)

(56) References Cited

U.S. PATENT DOCUMENTS 8,691,630 B2 * 4/2014 Pan ................... H01L 23/49541
257/676
10,128,205 B2   11/2018 Meyer et al.
(Continued)

FOREIGN PATENT DOCUMENTS

CN    1354509 A    6/2002
CN    1416160 A    5/2003
(Continued)

OTHER PUBLICATIONS

International Search Report issued in corresponding International Application No. PCT/CN2019/125365, dated Sep. 2, 2020, pp. 1-11.
(Continued)

*Primary Examiner* — Mandeep S Buttar
(74) *Attorney, Agent, or Firm* — HAUPTMAN HAM, LLP

(57) ABSTRACT

An electronic element includes a substrate, a first input pad on a first surface of the substrate, at least one chip on the first surface of the substrate, and a first output pad on the first surface of the substrate. The first input pad, the at least one chip, and the first output pad are sequentially connected. The first input pad and the first output pad are in direct physical contact with the first surface of the substrate. A surface of the first input pad facing away from the substrate and a surface of the first output pad facing away from the substrate constitute a partial area of an outer surface of the electronic element.

16 Claims, 6 Drawing Sheets

(58) Field of Classification Search
CPC . H01L 2924/01029; H01L 2924/15311; H01L 2224/73265; H01L 24/49; H01L 2924/14; H01L 2224/0401; H01L 23/66; H01L 2223/6677; H01L 23/3114; H01L 23/4951; H01L 23/3121; H01L 2924/18165; H01L 2223/6627; H01L 21/56; H01L 23/3128; H01L 23/315; H01L 33/486; H01L 2224/48257; H01L 2224/32145; H01L 25/0655; H01L 24/97; H01L 23/49822; H01L 23/50; H05K 2201/09036; H05K 1/183; H05K 2201/09845; H05K 2203/0369; H05K 3/403; H05K 1/181; H05K 1/0203; H05K 1/025; H05K 1/111
See application file for complete search history.

(56) References Cited

U.S. PATENT DOCUMENTS

| | | | | |
|---|---|---|---|---|
| 2004/0202927 | A1* | 10/2004 | Drea | H01M 50/213 |
| | | | | 429/129 |
| 2005/0104205 | A1 | 5/2005 | Wang | |
| 2009/0102740 | A1* | 4/2009 | Rofougaran | H01Q 23/00 |
| | | | | 343/860 |
| 2012/0212918 | A1* | 8/2012 | Dohle | H01L 21/563 |
| | | | | 361/770 |
| 2013/0105950 | A1 | 5/2013 | Bergemont et al. | |
| 2013/0175686 | A1 | 7/2013 | Meyer et al. | |
| 2015/0255412 | A1* | 9/2015 | Meyer | H01L 25/50 |
| | | | | 361/679.55 |
| 2017/0365556 | A1* | 12/2017 | Mori | H01L 23/49811 |
| 2022/0225512 | A1* | 7/2022 | Yang | H05K 1/186 |

FOREIGN PATENT DOCUMENTS

| | | | | |
|---|---|---|---|---|
| CN | 1440058 A | 9/2003 | | |
| CN | 1591862 A | 3/2005 | | |
| CN | 108447852 A | 8/2018 | | |
| DE | 4213251 A1 | 10/1992 | | |
| DE | 102012110000 A1 | 5/2013 | | |
| EP | 3109898 A1 * | 12/2016 | | H01L 23/13 |
| EP | 3258749 A1 | 12/2017 | | |
| JP | H04322452 A | 11/1992 | | |
| JP | 2017224788 A | 12/2017 | | |

OTHER PUBLICATIONS

Japanese Office Action issued in corresponding Japanese Application No. 2022-535671, dated Sep. 4, 2023, pp. 1-16.
Extended European Search Report issued in corresponding European Application No. 19955622.6, dated Nov. 8, 2022, pp. 1-10.
Chinese First Office Action issued in corresponding Chinese Application No. 201980102721.4, dated Apr. 30, 2025, pp. 1-9.

* cited by examiner

ELECTRONIC ELEMENT, CIRCUIT BOARD WITH ELECTRONIC ELEMENT, AND ELECTRONIC DEVICE

CROSS-REFERENCE TO RELATED APPLICATIONS

This application is a continuation of International Application No. PCT/CN2019/125365, filed on Dec. 13, 2019, the disclosure of which is hereby incorporated by reference in its entirety.

TECHNICAL FIELD

This application relates to the field of electronic device technologies, and in particular, to an electronic element, a circuit board with an electronic element, and an electronic device.

BACKGROUND

In electronic devices such as a wireless base station, heat dissipation needs to be performed on a circuit board with a high integrated high-density arrangement of electronic elements on the circuit board. In addition, to integrate more electronic elements on the circuit board, the electronic elements tend to be modular.

For example, FIG. 1 is a modular electronic element 01 in the conventional technology. As shown in FIG. 1, the electronic element 01 includes a substrate 011, a chip 012, an input pad 013, an output pad 014, and a plastic packaging layer 015. The substrate 011 includes a first surface 011a and a second surface 011b that are opposite to each other. The chip 012 is disposed on the first surface 011a, the input pad 013 and the output pad 014 are disposed on the second surface 011b. An input terminal of the chip 012 is connected to the input pad 013 through a first metalized through hole 016, and an output terminal of the chip 012 is connected to the output pad 014 through a second metalized through hole 017. The plastic packaging layer 015 is disposed on the first surface 011a of the substrate 011, and wraps the chip 012.

The electronic element 01 shown in FIG. 1 is usually surface-mounted on a circuit board. FIG. 2 is a schematic diagram of a structure of the electronic element 01 surface-mounted on a circuit board 02. Refer to FIG. 2. The substrate 011 of the electronic element 01 is attached to the circuit board 02. The input pad and the output pad of the electronic element 01 are respectively welded to an output pad and an input pad of the circuit board 02. A surface of the circuit board 02 facing away from the electronic element 01 is attached to a radiator 03 by using a colloid heat conducting material. In this way, heat generated by the chip 012 in the electronic element 01 is transferred to the radiator 03 after sequentially passing through the substrate 011 and the circuit board 02, to cool the electronic element 01. This cooling path is long, and heat dissipation efficiency is low. To improve heat dissipation efficiency of an electronic element, in some conventional technologies, the electronic element 01 is attached to a surface of a circuit board facing a radiator in a flip-mounted manner. FIG. 3 is a schematic diagram of a structure of the electronic element 01 attached to the surface of the circuit board 02 facing the radiator 03 in a flip-mounted manner. Refer to FIG. 3. The substrate 011 of the electronic element 01 is directly attached to the radiator 03, and a heat dissipation path of the electronic element 01 is short, and heat dissipation efficiency is high. When the electronic element 01 is flip-mounted, an electrical connection structure needs to be disposed in the electronic element 01, to lead out the input terminal and the output terminal of the chip 012, to implement electrical connection to the circuit board 02. In some existing solutions, as shown in FIG. 3, the input pad 013 and the output pad 014 of the electronic element 01 are disposed on the first surface 011a of the substrate 011. The input terminal of the chip 012 is connected to the input pad 013, and the output terminal of the chip 012 is connected to the output pad 014. The input pad 013 and the output pad 014 each are welded with a copper pillar A, and the copper pillar A is encapsulated in the encapsulation layer 015. A surface of one terminal of the copper pillar A facing away from the substrate 011 is not covered by the encapsulation layer 015. The electronic element 01 is welded to the input pad and the output pad of the circuit board 02 through surfaces of two copper pillars A facing away from the substrate 011. To implement good impedance matching of the electronic element 01, processing accuracy and assembling accuracy of the copper pillar A are required to be high. However, because a size of the electronic element 01 is small, a diameter and a length of the copper pillar A that can be installed in the electronic element 01 are short, resulting in large processing difficulty, low accuracy, and low assembling accuracy of the copper pillar A on the substrate 011. This easily affects input/output impedance matching performance of the electronic element 01. In some other existing solutions, as shown in FIG. 4, a printed circuit board B with a metalized through hole is used to replace the copper pillar A in a solution shown in FIG. 3. The input pad 013 and the output pad 014 are respectively connected to the input pad and the output pad of the circuit board 2 through two metalized through holes on the printed circuit board B. Supported by the printed circuit board B, dimensional accuracy of the metalized through hole may be high, so that an influence on input/output impedance matching performance of the electronic element 01 can be reduced to some extent. However, in a process of processing and assembling of the printed circuit board B with a metalized through hole, there may be an unavoidable error, and the input/output impedance matching performance of the electronic element 01 is still affected.

SUMMARY

Embodiments of this application provide an electronic element, a circuit board with an electronic element, and an electronic device, to shorten a heat dissipation path of the electronic element, improve heat dissipation efficiency of the electronic element, and ensure input/output impedance matching performance of the electronic element.

To achieve the foregoing objectives, the following technical solutions are used in embodiments of this application.

According to a first aspect, some embodiments of this application provide an electronic element, including a substrate, and a first input pad, at least one chip, and a first output pad that are disposed on a first surface of the substrate. The chip includes but is not limited to a power amplifier chip. The first input pad, the at least one chip, and the first output pad are sequentially connected. The first input pad and the first output pad are directly disposed on the first surface of the substrate. A surface of the first input pad facing away from the substrate and a surface of the first output pad facing away from the substrate constitute a partial area of an outer surface of the electronic element.

Compared with that in a conventional technology, when the electronic element provided in this embodiment of this application is flip-mounted on a circuit board and attached to a radiator, heat generated by the at least one chip in the electronic element during operation may be directly transferred to the radiator through the substrate. Therefore, the circuit board with the electronic element has a short heat dissipation path and high heat dissipation efficiency. In addition, the first input pad and the first output pad are directly disposed on the first surface of the substrate, and the surface of the first input pad facing away from the substrate and the surface of the first output pad facing away from the substrate constitute a partial area of the outer surface of the electronic element. Therefore, the surface of the first input pad facing away from the substrate and the surface of the first output pad facing away from the substrate are disposed to be exposed. That is, the surface of the first input pad facing away from the substrate and the surface of the first output pad facing away from the substrate are not covered. The first input pad and the first output pad may be directly welded to an output pad and an input pad that are on the circuit board. There is no intermediate connection structure between the first input pad and the output pad on the circuit board and between the first output pad and the input pad on the circuit board. A lead-out path of each of an input terminal and an output terminal of the chip in the electronic element is short, and accuracy of the lead-out line is high. Therefore, input/output impedance matching performance of the electronic element can be effectively ensured.

Optionally, the substrate includes a heat dissipation layer and a dielectric layer that are stacked. At least one accommodate groove is disposed on the dielectric layer, and the accommodate groove penetrates the dielectric layer. An area that is on a surface of the heat dissipation layer and that is opposite to the accommodate groove, a side of the accommodate groove, and a surface of the dielectric layer facing away from the heat dissipation layer constitute the first surface of the substrate. The at least one chip is disposed in the at least one accommodate groove and is fastened in the area that is on the surface of the heat dissipation layer and that is opposite to the accommodate groove. The first input pad and the first output pad are disposed on the surface of the dielectric layer facing away from the heat dissipation layer. In this way, because heat conducting performance of the heat dissipation layer is good, heat generated by the at least one chip during operation may be rapidly transferred from the heat dissipation layer to the radiator. This improves heat dissipation performance of the electronic element. In addition, because the dielectric layer has insulation performance, the dielectric layer may implement insulation isolation between the first input pad and the heat dissipation layer, between the first output pad and the heat dissipation layer, and between the heat dissipation layer and a connection line among the first input pad, the at least one chip, and the first output pad, to prevent a short circuit. In addition, because the at least one chip is disposed in the at least one accommodate groove, the at least one chip may be prevented from protruding beyond a contour of the substrate. This avoids interference between the at least one chip and the circuit board when the electronic element is connected to the circuit board.

Optionally, an impedance matching circuit is further included. The first input pad, the at least one chip, and the first output pad are connected through the impedance matching circuit. In this way, impedance matching is performed on an input, an output, or an interstage of the at least one chip through the impedance matching circuit, so that microwave signal energy is transmitted as much as possible to another load that is on the at least one chip or the circuit board and that is connected to an output terminal of the electronic element.

Optionally, the at least one chip includes one chip, and the impedance matching circuit includes a first impedance matching circuit and a second impedance matching circuit. The first input pad is connected to an input terminal of the chip through the first impedance matching circuit, and an output terminal of the chip is connected to the first output pad through the second impedance matching circuit. The first impedance matching circuit matches output impedance of a load that is on the circuit board and that is connected to the first input pad to input impedance of the chip. The second impedance matching circuit matches output impedance of the chip to input impedance of a load that is on the circuit board and that is connected to the first output pad. In this way, all signals output by the load that is on the circuit board and that is connected to the first input pad can be transmitted to the chip, and all signals output by the chip can be transmitted to the load that is on the circuit board and that is connected to the first output pad. Therefore, signal reflection is reduced, and a loss of signal energy is reduced.

Optionally, the at least one chip includes two chips, and the impedance matching circuit includes a first impedance matching circuit, a second impedance matching circuit, and a third impedance matching circuit. The first input pad is connected to an input terminal of one chip through the first impedance matching circuit. An output terminal of the chip is connected to an input terminal of the other chip through the third impedance matching circuit. An output terminal of the other chip is connected to the first output pad through the second impedance matching circuit. The first impedance matching circuit matches output impedance of a load that is on the circuit board and that is connected to the first input pad to input impedance of the chip. The third impedance matching circuit matches output impedance of the chip to input impedance of the other chip. The second impedance matching circuit matches output impedance of the other chip to input impedance of a load that is on the circuit board and that is connected to the first output pad. In this way, all signals output by the load that is on the circuit board and that is connected to the first input pad can be transmitted to the chip, all signals output by the chip can be transmitted to the other chip, and all signals output by the other chip can be transmitted to the load that is on the circuit board and that is connected to the first output pad. Therefore, signal reflection is reduced, and a loss of signal energy is reduced.

Optionally, a connection line among the first input pad, the at least one chip, and the first output pad includes a first part and a second part. The first part is disposed on the surface of the dielectric layer facing away from the heat dissipation layer, and the second part is connected between the first part and the at least one chip. The electronic element further includes an encapsulation layer, the encapsulation layer is disposed on the first surface of the substrate, and the encapsulation layer warps the at least one chip and the second part. In this way, the chip and the second part are protected by using the encapsulation layer, so that the second part is prevented from being scratched and broken in a transport process of the electronic element, and water and dust are also prevented from touching the chip, thereby prolonging a service life of the chip.

Optionally, the encapsulation layer is disposed on the first surface of the substrate by using a glue dispensing process. When used for producing an encapsulation layer, the glue dispensing process has high accuracy, so that the encapsulation layer does not cover the first input pad and the first output pad, to avoid affecting welding between the circuit board and each of the first input pad and the first output pad.

Optionally, the at least one chip is a power amplifier chip.

Optionally, the at least one chip includes a plurality of chips, and the plurality of chips are connected in series between the first input pad and the first output pad.

According to a second aspect, some embodiments of this application provide a circuit board with an electronic element, including a circuit board and the electronic element described in any one of the foregoing technical solutions. A second output pad and a second input pad are disposed on a first surface of the circuit board, and the second output pad and the second input pad are connected to a circuit of the circuit board. The electronic element is located on a side of each of the second output pad and the second input pad facing away from the circuit board. A first surface of a substrate of the electronic element faces toward the circuit board. A first input pad of the electronic element is directly welded to the second output pad, and a first output pad of the electronic element is directly welded to the second input pad.

Compared with that in the conventional technology, when the circuit board with an electronic element provided in this embodiment of this application is attached to a radiator by using the electronic element, heat generated by at least one chip in the electronic element during operation may be directly transferred to the radiator by using the substrate. Therefore, the circuit board with an electronic element has a short heat dissipation path and high heat dissipation efficiency. In addition, the first input pad and the first output pad are directly disposed on the first surface of the substrate. The first input pad, the at least one chip, and the first output pad are sequentially connected. The electronic element is directly welded to the second output pad and the second input pad of the circuit board by using the first input pad and the first output pad. Therefore, there is no intermediate connection structure between the first input pad and the second output pad and between the first output pad and the second input pad. A lead-out path of each of an input terminal and an output terminal of the chip in the electronic element is short, and accuracy of the lead-out line is high. Therefore, input/output impedance matching performance of the electronic element can be effectively ensured.

Optionally, the electronic element includes an impedance matching circuit. The first input pad, the at least one chip of the electronic element, and the first output pad are connected through the impedance matching circuit. A groove is disposed on the circuit board opposite to the impedance matching circuit, and the impedance matching circuit is accommodated in the groove. In this way, a distance between the impedance matching circuit and stacked cabling in the circuit board is extended by the groove, so that the stacked cabling in the circuit board does not affect the impedance matching circuit. In addition, the impedance matching circuit is avoided by the groove, to avoid interference between the impedance matching circuit and the circuit board.

Optionally, a metal shield layer is disposed on both a side and a bottom of the groove. The metal shield layer can shield and isolate the impedance matching circuit from the stacked cabling in the circuit board, to prevent the impedance matching circuit from being affected by the stacked cabling in the circuit board.

Optionally, a depth of the groove is 2 mm to 3 mm. When the depth of the groove is within this range, the depth of the groove is moderate, so that the impedance matching circuit can be avoided, and structural strength of the circuit board and performance of the impedance matching circuit can also be considered.

Optionally, the circuit board with an electronic element is a massive multi-input multi-output antenna transceiver circuit board.

According to a third aspect, some embodiments of this application provide an electronic device, including a radiator and the circuit board with an electronic element described in any one of the foregoing technical solutions. The radiator is located on a side of the electronic element facing away from the circuit board. A surface of the electronic element facing away from the circuit board is attached to a surface of the radiator. Alternatively, there is a gap between a surface of the electronic element facing away from the circuit board and a surface of the radiator, and the gap is filled with a heat conducting material.

According to the electronic device provided in this embodiment of this application, because the electronic device includes the circuit board with an electronic element described in any one of the foregoing technical solutions, the electronic device provided in this embodiment of this application can resolve a same technical problem and achieve a same expected effect as the circuit board with an electronic element described in any one of the foregoing technical solutions.

Optionally, the electronic device is a wireless base station.

REFERENCE NUMERALS

Figure 1:
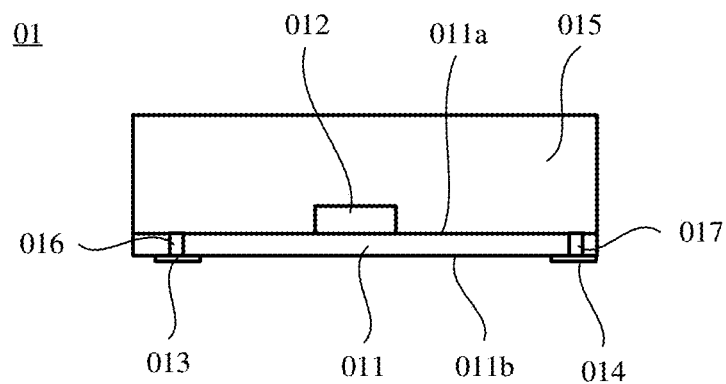
FIG. 1 is a schematic diagram of a structure of an electronic element in the conventional technology.
Figure 2:
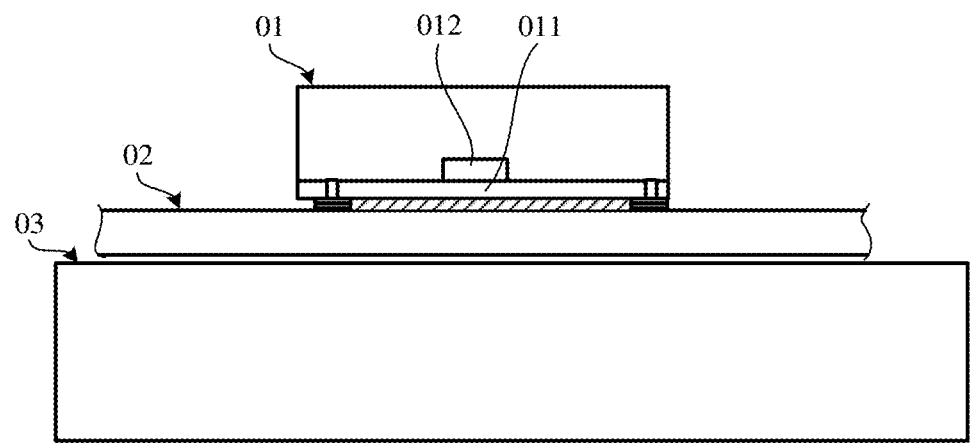
FIG. 2 is a schematic diagram of a first assembly structure of an electronic element, a circuit board, and a radiator in the conventional technology.
Figure 3:
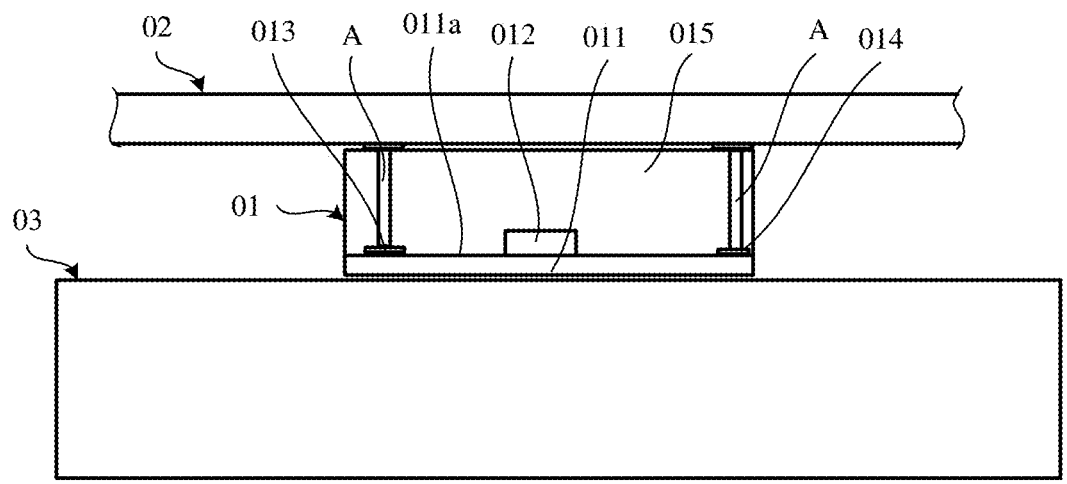
FIG. 3 is a schematic diagram of a second assembly structure of an electronic element, a circuit board, and a radiator in the conventional technology.
Figure 4:
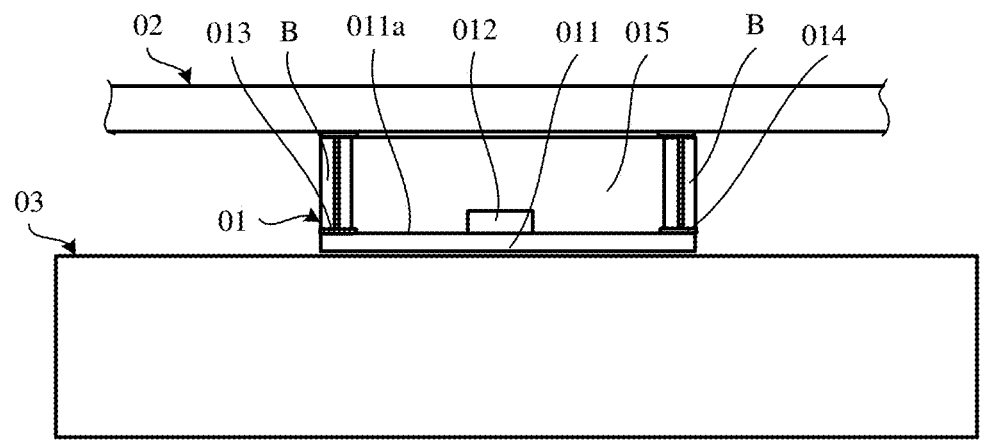
FIG. 4 is a schematic diagram of a third assembly structure of an electronic element, a circuit board, and a radiator in the conventional technology.

01—electronic element; 011—substrate; 012—chip; 013—input pad; 014—output pad; 015—plastic packaging layer; 011a—first surface of a substrate; 011b—second surface of a substrate; 016—first metalized through hole; 017—second metalized through hole; 02—circuit board; 03—radiator; 1—radiator; 2—circuit board with an electronic element; 21—circuit board; 21a—first surface of a circuit board; 211—second output pad; 212—second input pad; 22—electronic element; 221—substrate; 221a—first surface of a substrate; 2211—heat dissipation layer; 2212—dielectric layer; 2213—accommodate groove; 221a1—area on a surface of a heat dissipation layer opposite to an accommodate groove; 221a2—side of an accommodate groove; 221a3—surface of a dielectric layer facing away from a heat dissipation layer; 222—first input pad; 223—chip; 224—first output pad; 225—impedance matching circuit; 2251—first impedance matching circuit; 2252—second impedance matching circuit; 2253—third impedance matching circuit; 226—encapsulation layer; 23—groove; 100—connection line; 101—first part of a connection line; and 102—second part of a connection line.

DESCRIPTION OF EMBODIMENTS

Embodiments of this application relate to an electronic element, a circuit board with an electronic element, and an electronic device. The following briefly describes concepts involved in the embodiments.

An electronic device is a device that has an electronic circuit inside and a function by applying electronic technology software.

A circuit board is a structure that is formed by a dielectric layer and a line, a pad, and a through hole that are disposed on the dielectric layer, and is configured to implement interconnection between electronic elements to constitute an electronic circuit with a specific function.

Electric polarization refers to a phenomenon that a macroscopic electric dipole moment that is not equal to zero is generated under an action of an external electric field, thereby forming a macroscopic bound charge.

A dielectric refers to a substance that can generate an electric polarization phenomenon, including a crystalline dielectric layer and an amorphous dielectric layer, where a resistivity of the dielectric is usually high, and the dielectric has insulation performance.

A dielectric layer is a layer structure formed by a dielectric.

An electronic element is a basic element in an electronic circuit, is usually individually encapsulated, and has two or more pins.

Impedance matching circuit: Impedance matching is a part of microwave electronics, is mainly used on a transmission line, to achieve that all high-frequency microwave signal can be transmitted to a load point, and almost no signal is reflected back to a source point, thereby improving energy efficiency.

In an electronic device such as a wireless base station, with a high integrated high-density arrangement of electronic elements on the circuit board, effective heat dissipation needs to be performed on the circuit board with an electronic element. In addition, accuracy of a lead-out line of each of an input terminal and an output terminal of a chip in the electronic element need to be high, to ensure impedance matching performance of the electronic element.

Figure 5:
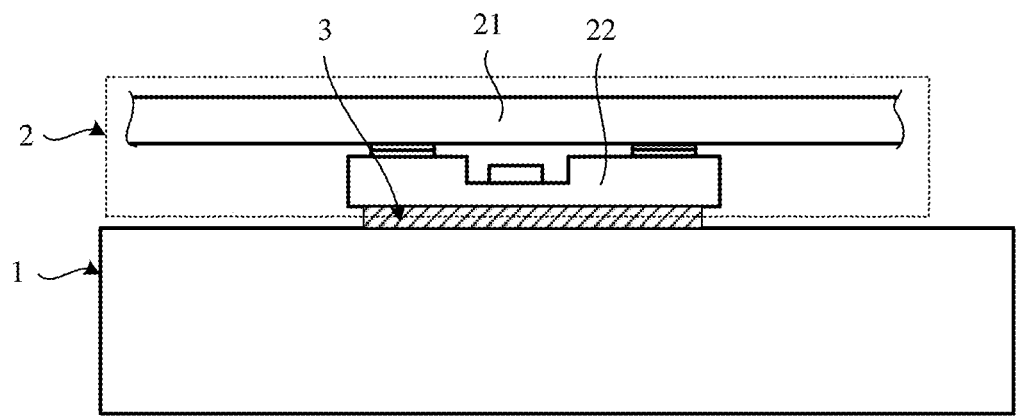
FIG. 5 is a schematic diagram of a structure of an electronic device according to an embodiment of this application.

To achieve the foregoing two objectives, FIG. 5 is a schematic diagram of an electronic device according to some embodiments of this application. The electronic device includes but is not limited to a wireless base station. As shown in FIG. 5, the electronic device includes a radiator 1 and a circuit board 2 with an electronic element. The radiator 1 includes but is not limited to a fin radiator and a refrigerant cooled radiator.

Figure 6:
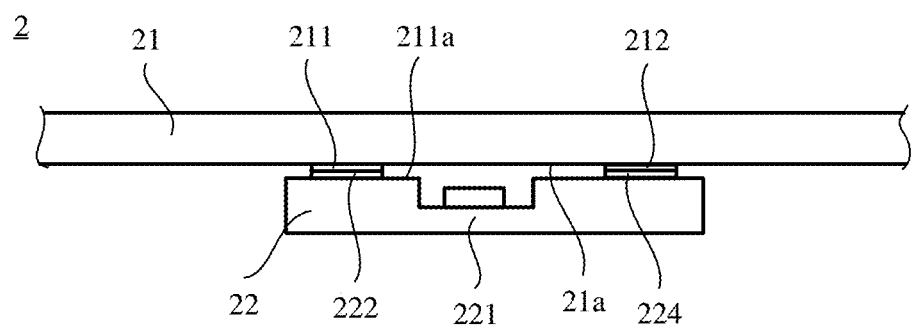
FIG. 6 is a schematic diagram of a structure of a first circuit board with an electronic element according to an embodiment of this application.

FIG. 6 is a schematic diagram of a circuit board with an electronic element according to some embodiments of this application. The circuit board 2 with an electronic element is an electronic circuit structure with a specific function, for example, a massive multiple-input multiple-output (massive multiple-input multiple-output, Massive MIMO) antenna transceiver circuit board in the wireless base station. As shown in FIG. 6, the circuit board 2 with an electronic element includes a circuit board 21 and an electronic element 22.

Figure 7:
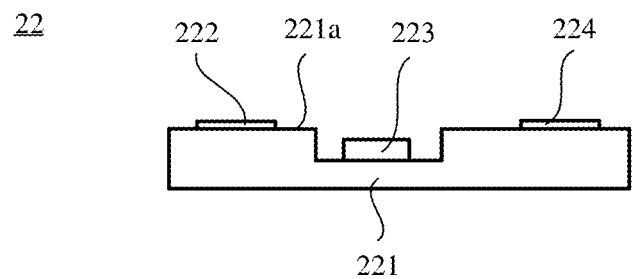
FIG. 7 is a schematic diagram of a structure of a first electronic element according to an embodiment of this application.

FIG. 7 is a schematic diagram of an electronic element 22 according to some embodiments of this application. The electronic element 22 includes but is not limited to a power amplifier module (power amplifier module, PAM). As shown in FIG. 7, the electronic element 22 includes a substrate 221, and a first input pad 222, at least one chip 223, and a first output pad 224 that are disposed on a first surface 221a of the substrate 221. The chip 223 includes but is not limited to a power amplifier chip. The first input pad 222, the at least one chip 223, and the first output pad 224 are sequentially connected. The first input pad 222 and the first output pad 224 are directly disposed on the first surface 221a of the substrate 221. A surface of the first input pad 222 facing away from the substrate 221 and a surface of the first output pad 224 facing away from the substrate 221 constitute a partial area of an outer surface of the electronic element 22.

It should be noted that the first input pad 222 and the first output pad 224 are directly disposed on the first surface 221a of the substrate 221, that is, the first input pad 222 and the first output pad 224 are directly in contact with and fastened to the first surface 221a of the substrate 221. There is no intermediate connection structure between the first input pad 222 and the first surface 221a of the substrate 221 and between the first output pad 224 and the first surface 221a of the substrate 221.

It should be noted that the surface of the first input pad 222 facing away from the substrate 221 and the surface of the first output pad 224 facing away from the substrate 221 constitute a partial area of the outer surface of the electronic element 22. Therefore, the surface of the first input pad 222 facing away from the substrate 221 and the surface of the first output pad 224 facing away from the substrate 221 are disposed to be exposed. That is, the surface of the first input pad 222 facing away from the substrate 221 and the surface of the first output pad 224 facing away from the substrate 221 are not covered.

The at least one chip 223 may include one chip 223, or may include a plurality of chips 223, which is not specifically limited herein. In some embodiments, the at least one chip 223 includes a plurality of chips 223, and the plurality of chips 223 are connected in series between the first input pad 222 and the first output pad 224.

As shown in FIG. 6, a second output pad 211 and a second input pad 212 are disposed on a first surface 21a of the circuit board 21. The second output pad 211 and the second input pad 212 are connected to a circuit of the circuit board 21. The electronic element 22 is located on a side of each of the second output pad 211 and the second input pad 212 facing away from the circuit board 21. The first surface 221a of the substrate 221 of the electronic element 22 faces toward the circuit board 21. The first input pad 222 of the electronic element 22 is directly welded to the second output pad 212, and the first output pad 224 of the electronic element 22 is directly welded to the second input pad 211.

It should be noted that the first input pad 222 of the electronic element 22 is directly welded to the second output pad 212, that is, the first input pad 222 of the electronic element 22 is directly in contact with and welded to the second output pad 212. There is no intermediate connection structure between the first input pad 222 of the electronic element 22 and the second output pad 212.

Similarly, the first output pad 224 of the electronic element 22 is directly welded to the second input pad 211, that is, the first output pad 224 of the electronic element 22 is directly in contact with and welded to the second input pad 211. There is no intermediate connection structure between the first output pad 224 of the electronic element 22 and the second input pad 211.

As shown in FIG. 5, the radiator 1 is located on a side of the electronic element 22 facing away from the circuit board 21, and a surface of the electronic element 22 facing away from the circuit board 21 is attached to a surface of the radiator 1.

Alternatively, there is a gap between a surface of the electronic element 22 facing away from the circuit board 21 and a surface of the radiator 1, and the gap is filled with a heat conducting material 3. The heat conducting material 3 includes but is not limited to thermally conductive silicone and thermal silica gel.

In this way, heat generated by the at least one chip 223 in the electronic element 22 during operation can be directly transferred to the radiator 1 by using the substrate 221. Therefore, a heat dissipation path of the circuit board 2 with an electronic element is short, and heat dissipation efficiency is high.

In addition, the first input pad 222 and the first output pad 224 are directly disposed on the first surface 221a of the substrate 221. The first input pad 222, the at least one chip 223, and the first output pad 224 are sequentially connected. The electronic element 22 is directly welded to the second output pad 212 and the second input pad 211 of the circuit board 21 by using the first input pad 222 and the first output pad 224. Therefore, there is no intermediate connection structure between the first input pad 222 and the second output pad 212 and between the first output pad 224 and the second input pad 211. A lead-out path of each of an input terminal and an output terminal of the chip 223 in the electronic element 22 is short, and accuracy of the lead-out line is high. Therefore, input/output impedance matching performance of the electronic element 22 can be effectively ensured.

Figure 8:
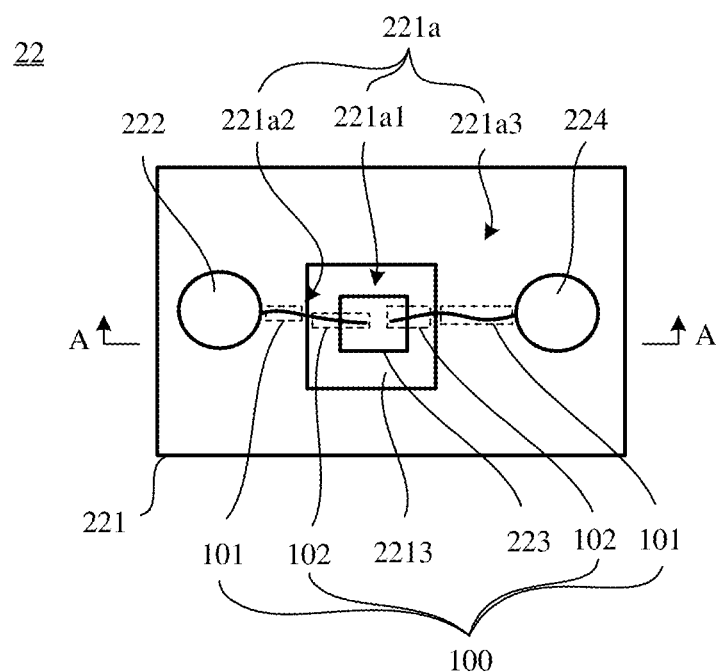
FIG. 8 is a schematic diagram of a structure of a second electronic element according to an embodiment of this application.
Figure 9:
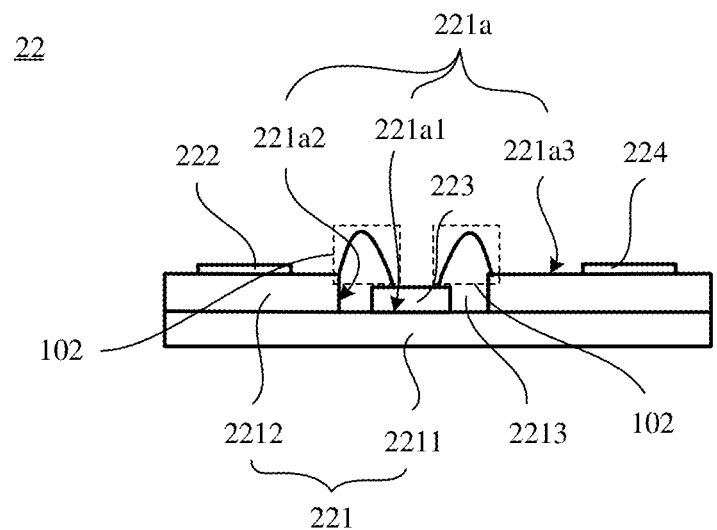
FIG. 9 is a sectional view of the electronic element shown in FIG. 8 along a section A-A.

To enable the substrate 221 to transfer the heat generated by the chip 223 during operation to the radiator, in some embodiments, as shown in FIG. 8 and FIG. 9, the substrate 221 includes a heat dissipation layer 2211 and a dielectric layer 2212 that are stacked. A material of the heat dissipation layer 2211 includes but is not limited to aluminum-based metal and copper. The dielectric layer 2212 has insulation performance. At least one accommodate groove 2213 is disposed on the dielectric layer 2212. The accommodate groove 2213 penetrates the dielectric layer 2212. An area 221a1 that is on a surface of the heat dissipation layer 2211 and that is opposite to the accommodate groove 2213, a side 221a2 of the accommodate groove 2213, and a surface 221a3 of the dielectric layer 2212 facing away from the heat dissipation layer 2211 constitute the first surface 221a of the substrate 221. The at least one chip 223 is disposed in the at least one accommodate groove 2213 and is fastened in the area 221a1 that is on the surface of the heat dissipation layer 2211 and that is opposite to the accommodate groove 2213. The first input pad 222 and the first output pad 224 are disposed on the surface 221a3 of the dielectric layer 2212 facing away from the heat dissipation layer 2211.

In this way, because heat conducting performance of the heat dissipation layer 2211 is good, the heat generated by the at least one chip 223 during operation may be rapidly transferred from the heat dissipation layer 2211 to the radiator. This improves heat dissipation performance of the electronic element 22. In addition, because the dielectric layer 2212 has the insulation performance, the dielectric layer 2212 may implement insulation isolation between the first input pad 222 and the heat dissipation layer 2211, between the first output pad 224 and the heat dissipation layer 2211, and between the heat dissipation layer 2211 and a connection line among the first input pad 222, the at least one chip 223, and the first output pad 224, to prevent a short circuit. In addition, because the at least one chip 223 is disposed in the at least one accommodate groove 2213, the at least one chip 223 may be prevented from protruding beyond a contour of the substrate 221. This avoids interference between the at least one chip 223 and the circuit board when the electronic element 22 is connected to the circuit board 21.

Figure 10:
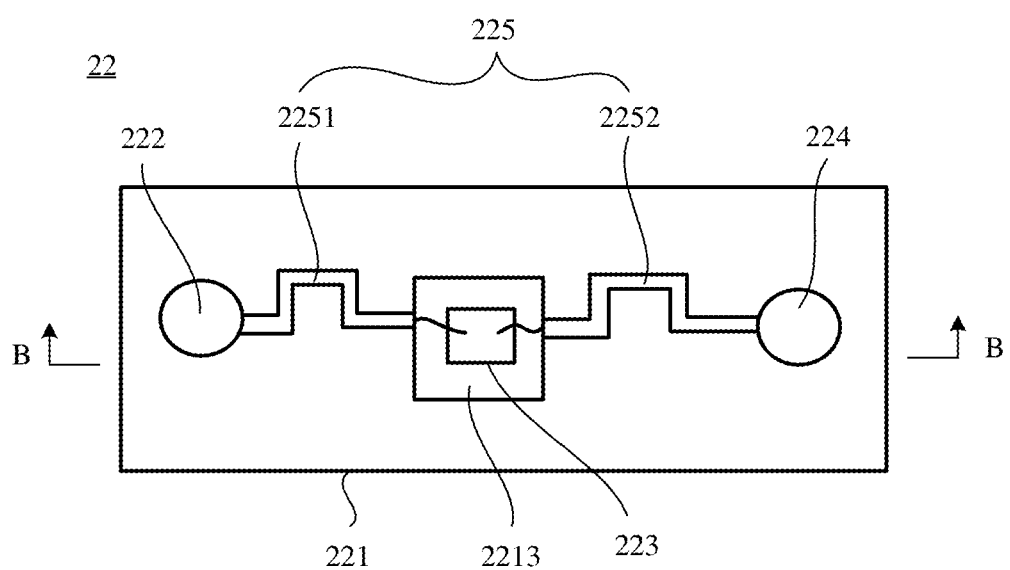
FIG. 10 is a schematic diagram of a structure of a third electronic element according to an embodiment of this application.
Figure 11:
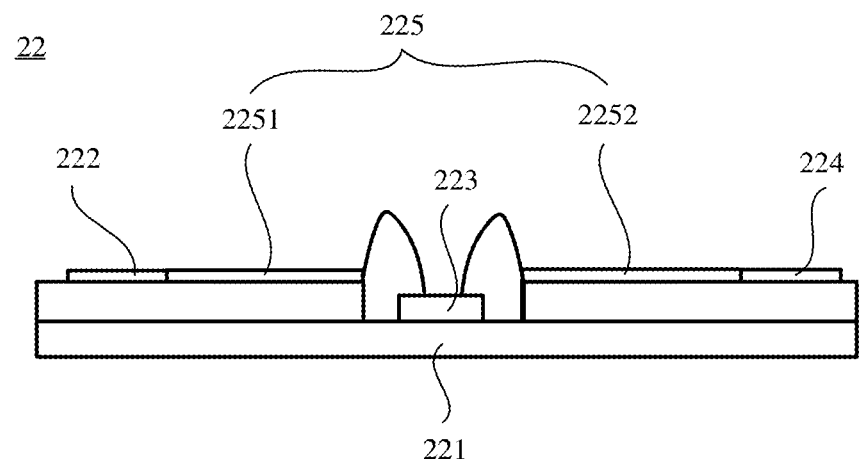
FIG. 11 is a sectional view of the electronic element shown in FIG. 10 along a section B-B.

When the electronic element 22 operates under a microwave signal, to reduce input reflection and output reflection of the at least one chip 223 to enable microwave signal energy to be transmitted as much as possible to another load that is on the at least one chip 223 or the circuit board and that is connected to an output terminal of the electronic element 22, in some embodiments, as shown in FIG. 10 or FIG. 11, an impedance matching circuit 225 is further included, and the first input pad 222, the at least one chip 223, and the first output pad 224 are connected through the impedance matching circuit 225. A structure of the impedance matching circuit 225 includes but is not limited to an electronic circuit formed by connecting a microstrip and an electronic element.

In this way, impedance matching is performed on an input, an output, or an interstage of the at least one chip 223 through the impedance matching circuit 225, so that the microwave signal energy is transmitted as much as possible to the another load that is on the at least one chip 223 or the circuit board and that is connected to the output terminal of the electronic element 22.

The structure of the impedance matching circuit 225 may be described in detail by using the following two examples:

Example 1: As shown in FIG. 10 and FIG. 11, the at least one chip 223 includes one chip 223, and the impedance matching circuit 225 includes a first impedance matching circuit 2251 and a second impedance matching circuit 2252. The first input pad 222 is connected to an input terminal of the chip 223 through the first impedance matching circuit 2251, and an output terminal of the chip 223 is connected to the first output pad 224 through the second impedance matching circuit 2252. The first impedance matching circuit 2251 matches output impedance of a load that is on the circuit board and that is connected to the first input pad 222 to input impedance of the chip 223. The second impedance matching circuit 2252 matches output impedance of the chip 223 to input impedance of a load that is on the circuit board and that is connected to the first output pad 224.

In this way, all signals output by the load that is on the circuit board and that is connected to the first input pad 222 can be transmitted to the chip 223, and all signals output by the chip 223 can be transmitted to the load that is on the circuit board and that is connected to the first output pad 224. Therefore, signal reflection is reduced, and a loss of signal energy is reduced.

Figure 12:
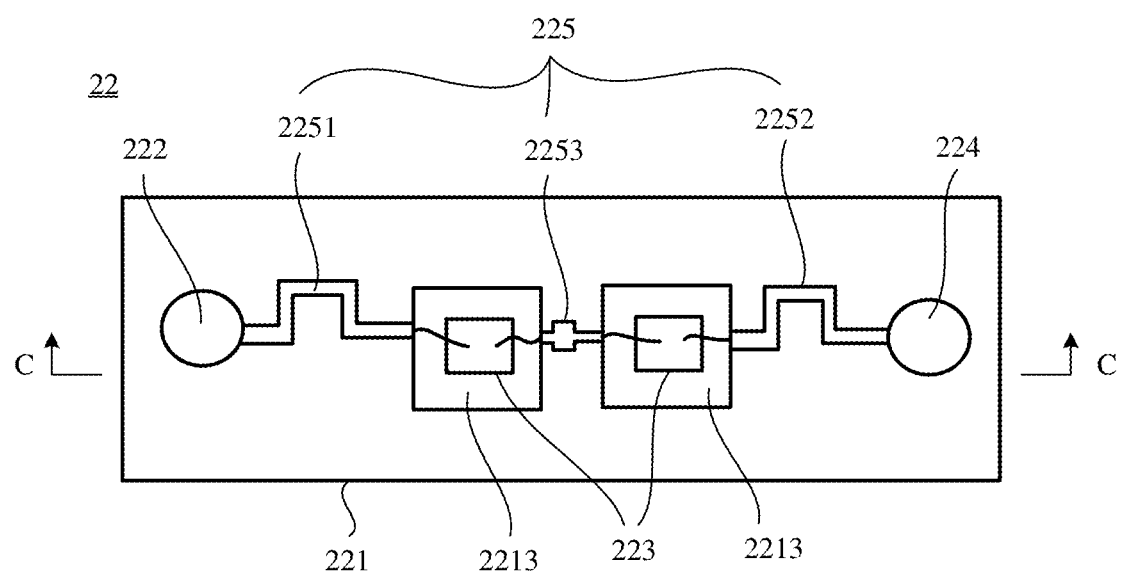
FIG. 12 is a schematic diagram of a structure of a fourth electronic element according to an embodiment of this application.
Figure 13:
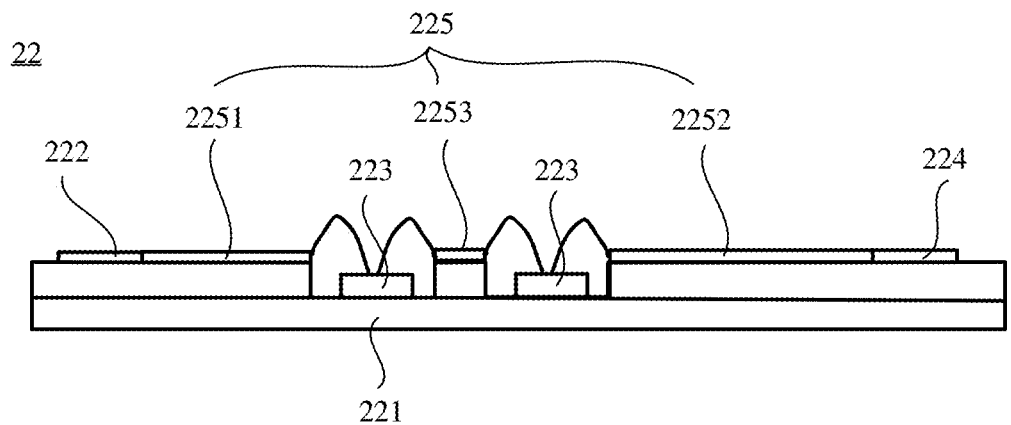
FIG. 13 is a sectional view of the electronic element shown in FIG. 12 along a section C-C.

Example 2: As shown in FIG. 12 and FIG. 13, the at least one chip 223 includes two chips 223, and the impedance matching circuit 225 includes a first impedance matching circuit 2251, a second impedance matching circuit 2252, and a third impedance matching circuit 2253. The first input pad 222 is connected to an input terminal of one chip 223 through the first impedance matching circuit 2251. An output terminal of the chip 223 is connected to an input terminal of the other chip 223 through the third impedance matching circuit 2253. An output terminal of the other chip 223 is connected to the first output pad 224 through the second impedance matching circuit 2252. The first impedance matching circuit 2251 matches output impedance of a load that is on the circuit board and that is connected to the first input pad 222 to input impedance of the chip 223. The third impedance matching circuit 2253 matches output impedance of the chip 223 to input impedance of the other chip 223. The second impedance matching circuit 2252 matches output impedance of the other chip 223 to input impedance of a load that is on the circuit board and that is connected to the first output pad 224.

In this way, all signals output by the load that is on the circuit board and that is connected to the first input pad 222 can be transmitted to the chip 223, all signals output by the chip 223 can be transmitted to the other chip 223, and all signals output by the other chip 223 can be transmitted to the load that is on the circuit board and that is connected to the first output pad 224. Therefore, signal reflection is reduced, and a loss of signal energy is reduced.

Figure 14:
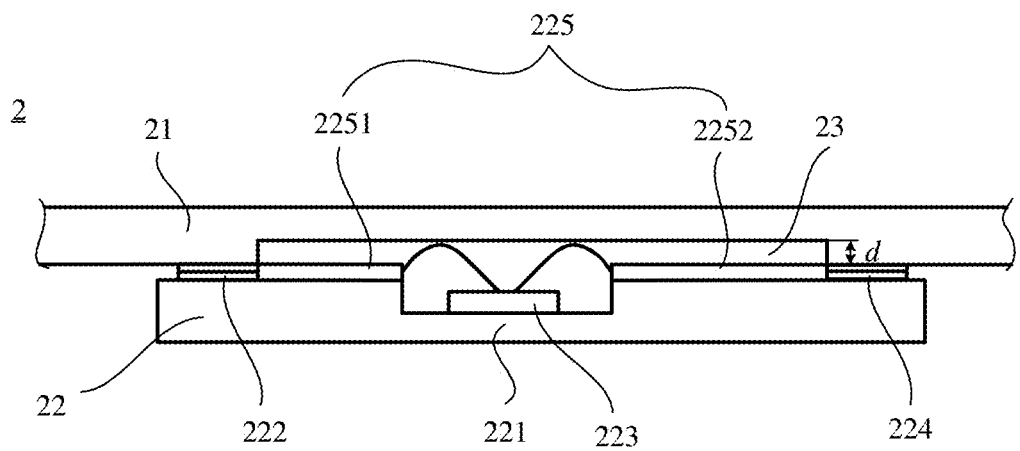
FIG. 14 is a schematic diagram of a structure of a second circuit board with an electronic element according to an embodiment of this application.

The circuit board 21 is stacked by a plurality of circuit board units, and cabling is disposed on each circuit board unit. In some embodiments, as shown in FIG. 14, a groove 23 is disposed on the circuit board 21 opposite to the impedance matching circuit 225, and the impedance matching circuit 225 is accommodated in the groove 23. Therefore, it is avoided that performance of the impedance matching circuit 225 is affected by stacked cabling in the circuit board 21 due to an excessively close distance between the impedance matching circuit 225 and the stacked cabling in the circuit board 21 when the electronic element 22 is connected to the circuit board 21, or interference between the impedance matching circuit 225 and the circuit board 21 generated when the electronic element 22 is connected to the circuit board 21 is avoided.

In this way, a distance between the impedance matching circuit 225 and the stacked cabling in the circuit board 21 is extended by the groove 23, so that the stacked cabling in the circuit board 21 does not affect the impedance matching circuit 225. In addition, the impedance matching circuit 225 is avoided by the groove 23, to avoid interference between the impedance matching circuit 225 and the circuit board 21.

In order to further avoid that the impedance matching circuit 225 is affected by the stacked cabling in the circuit board 21 when the electronic element 22 is connected to the circuit board 21, in some embodiments, a metal shield layer is disposed on both a side and a bottom of the groove 23. The metal shield layer can shield and isolate the impedance matching circuit 225 from the stacked cabling in the circuit board 21, to prevent the impedance matching circuit 225 from being affected by the stacked cabling in the circuit board 21.

A depth of the groove 23 may be 1 mm, 2 mm, 3 mm, or the like. This is not specifically limited herein. Specifically, a comprehensive design may be performed based on a height of the impedance matching circuit 225 protruding beyond the first surface 221*a* of the substrate 221, a structural strength requirement of the circuit board 21, and an influence of the depth of the groove 23 on the performance of the impedance matching circuit 225. Therefore, the groove 23 can accommodate the impedance matching circuit 225, structural strength of the circuit board 21 is ensured, and an influence of the stacked cabling in the circuit board 21 on the performance of the impedance matching circuit 225 is weakened as much as possible. In some embodiments, as shown in FIG. 14, the depth d of the groove 23 is 2 mm to 3 mm. When the depth d of the groove 23 is within this range, the depth of the groove 23 is moderate, so that the impedance matching circuit 225 can be avoided, and the structural strength of the circuit board 21 and the performance of the impedance matching circuit 225 can also be considered.

As shown in FIG. 8 and FIG. 9, on the first surface 221*a* of the substrate 221, a connection line 100 between the first input pad 222, the at least one chip 223, and the first output pad 224 includes a first part 101 and a second part 102. In some embodiments, the connection line 100 is the impedance matching circuit 225 shown in FIG. 10 to FIG. 13. The first part 101 is disposed on the surface 221*a*3 of the dielectric layer 2212 facing away from the heat dissipation layer 2211. The second part 102 is connected between the first part 101 and the at least one chip 223, and the second part 102 is suspended. The first part 101 is supported by the dielectric layer 2212, and is not easily scratched and broken by an external force in a process of moving the electronic element 22. However, because of suspension setting and a low strength of the connection line, the second part 102 is easily scratched and broken by an external force in the process of moving the electronic element 22. In addition, if the chip 223 is disposed to be exposed, in a long time transportation or storage process, the chip 223 may be eroded by water and dust in the air. Consequently, a service life of the chip 223 is shortened.

Figure 15:
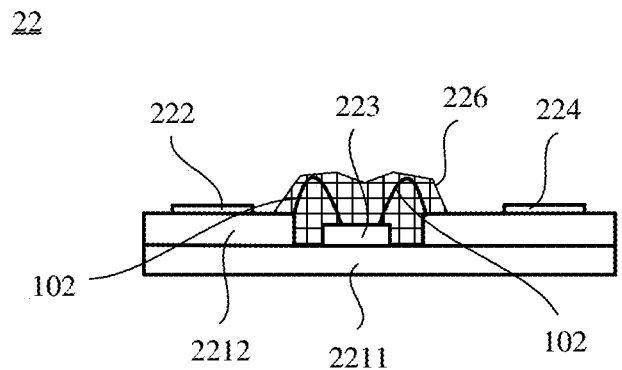
FIG. 15 is a schematic diagram of a structure of a fifth electronic element according to an embodiment of this application.

To resolve the foregoing problems, in some embodiments, as shown in FIG. 15, the electronic element 22 further includes an encapsulation layer 226. A material of the encapsulation layer 226 is an insulating material, including but not limited to epoxy and silicone plastics. The encapsulation layer 226 is disposed on the first surface 221*a* of the substrate 221, and the encapsulation layer 226 warps the at least one chip 223 and the second part 102.

In this way, the chip 223 and the second part 102 are protected by using the encapsulation layer 226, so that the second part 102 is prevented from being scratched and broken in a transport process of the electronic element 22, and water and dust are also prevented from touching the chip 223. This improves a product rate of the electronic element 22 in a processing and assembly process. The chip 223 is prevented from being eroded by external moisture and another factor, to ensure reliability of an electronic element product for long-term use.

The encapsulation layer 226 may be disposed on the first surface 221*a* of the substrate 221 by using a wrapper, or may be disposed on the first surface 221a of the substrate 221 by using a glue dispensing machine, which is not specifically limited herein. In some embodiments, the encapsulation layer 226 is disposed on the first surface 221a of the substrate 221 by using a glue dispensing process. When used for producing the encapsulation layer 226, the glue dispensing process has high accuracy, so that the encapsulation layer 226 does not cover the first input pad 222 and the first output pad 224, to avoid affecting welding between the circuit board and each of the first input pad 222 and the first output pad 224.

It should be noted that when the electronic element 22 having the encapsulation layer 226 is installed on the circuit board 21, the encapsulation layer 226 is accommodated in the groove 23, to avoid the encapsulation layer 226 by using the groove 23, to prevent interference between the encapsulation layer 226 and the circuit board 21.

In the descriptions of this specification, the specific features, structures, materials, or characteristics may be combined in an appropriate manner in any one or more of the embodiments or examples.

Finally, it should be noted that the foregoing embodiments are merely intended for describing the technical solutions of this application, but not for limiting this application. Although this application is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of embodiments of this application.

What is claimed is:

1. An electronic element, comprising:
an impedance matching circuit;
a substrate;
a first input pad on a first surface of the substrate;
at least one chip on the first surface of the substrate; and
a first output pad on the first surface of the substrate, wherein
the first input pad, the at least one chip, and the first output pad are sequentially connected,
the first input pad and the first output pad are in direct physical contact with the first surface of the substrate,
a surface of the first input pad facing away from the substrate and a surface of the first output pad facing away from the substrate constitute a partial area of an outer surface of the electronic element,
the first input pad, the at least one chip, and the first output pad are connected through the impedance matching circuit, and
the impedance matching circuit is in a groove defined in a circuit board opposite to the impedance matching circuit.

2. The electronic element according to claim 1, wherein
the substrate comprises a heat dissipation layer and a dielectric layer that are stacked,
at least one accommodate groove is defined within the dielectric layer,
an area that is on a surface of the heat dissipation layer within the at least one accommodate groove, one or more portions of the dielectric layer within the at least one accommodate groove defining at least a side of the at least one accommodate groove, and a surface of the dielectric layer facing away from the heat dissipation layer constitute the first surface of the substrate,
the at least one chip is in the at least one accommodate groove and on the surface of the heat dissipation layer, and
the first input pad and the first output pad are on the surface of the dielectric layer facing away from the heat dissipation layer.

3. The electronic element according to claim 2, further comprising:
an encapsulation layer on the first surface of the substrate, wherein
a connection line among the first input pad, the at least one chip, and the first output pad comprises a first part and a second part, the first part is on the surface of the dielectric layer facing away from the heat dissipation layer, and the second part connects the first part and the at least one chip, and
the encapsulation layer covers the at least one chip and the second part.

4. The electronic element according to claim 3, wherein the encapsulation layer comprises a cured material disposed on the first surface of the substrate in an uncured state by using a glue dispensing process.

5. The electronic element according to claim 1, wherein the at least one chip is a power amplifier chip.

6. The electronic element according to claim 1, wherein the at least one chip comprises a plurality of chips connected in series between the first input pad and the first output pad.

7. An apparatus, comprising:
an electronic element, comprising:
a substrate;
a first input pad on a first surface of the substrate;
at least one chip on the first surface of the substrate;
a first output pad on the first surface of the substrate; and
an impedance matching circuit; and
a circuit board, comprising:
a second output pad on a first surface of the circuit board;
a second input pad on the first surface of the circuit board; and
a circuit connected to the second output pad and to the second input pad,
wherein
the first input pad, the at least one chip, and the first output pad are sequentially connected,
the first input pad and the first output pad are in direct physical contact with the first surface of the substrate,
a surface of the first input pad facing away from the substrate and a surface of the first output pad facing away from the substrate constitute a partial area of an outer surface of the electronic element,
the electronic element is on a side of the second output pad and the second input pad facing away from the circuit board,
the first surface of the substrate of the electronic element faces toward the circuit board,
the first input pad of the electronic element is directly welded to the second output pad of the circuit board,
the first output pad of the electronic element is directly welded to the second input padof the circuit board,
the first input pad, the at least one chip, and the first output pad are connected through the impedance matching circuit, and
a groove is defined in the circuit board opposite to the impedance matching circuit, and the impedance matching circuit is in the groove.

8. The apparatus to claim 7, further comprising:
a metal shield layer on the circuit board along a side of the groove and along a bottom of the groove.

9. The apparatus to claim 7, wherein a depth of the groove into the circuit board from the first surface of the circuit board to a bottom of the groove is 2 mm to 3 mm.

10. The apparatus according to claim 7, wherein the circuit board and the electronic element are components of a massive multi-input multi-output antenna transceiver circuit board.

11. The apparatus according to claim 7, wherein
the substrate comprises a heat dissipation layer and a dielectric layer that are stacked,
at least one accommodate groove is defined within the dielectric layer,
an area that is on a surface of the heat dissipation layer within the at least one accommodate groove, one or more portions of the dielectric layer within the at least one accommodate groove defining at least a side of the at least one accommodate groove, and a surface of the dielectric layer facing away from the heat dissipation layer constitute the first surface of the substrate,
the at least one chip is in the at least one accommodate groove and on the surface of the heat dissipation layer, and
the first input pad and the first output pad are on the surface of the dielectric layer facing away from the heat dissipation layer.

12. The apparatus according to claim 11, further comprising:
an encapsulation layer on the first surface of the substrate, wherein
a connection line among the first input pad, the at least one chip, and the first output pad comprises a first part and a second part, the first part is on the surface of the dielectric layer facing away from the heat dissipation layer, and the second part connects the first part and the at least one chip, and
the encapsulation layer covers the at least one chip and the second part.

13. The apparatus according to claim 12, wherein the encapsulation layer comprises a cured material disposed on the first surface of the substrate in an uncured state by using a glue dispensing process.

14. The apparatus according to claim 7, wherein the at least one chip is a power amplifier chip.

15. The apparatus according to claim 7, wherein the at least one chip comprises a plurality of chips connected in series between the first input pad and the first output pad.

16. An electronic device, comprising:
a radiator;
an electronic element, comprising:
  a substrate;
  a first input pad on a first surface of the substrate;
  at least one chip on the first surface of the substrate;
  a first output pad on the first surface of the substrate; and
  an impedance matching circuit; and
a circuit board, comprising:
  a second output pad on a first surface of the circuit board;
  a second input pad on the first surface of the circuit board; and
  a circuit connected to the second output pad and to the second input pad,
wherein
  the first input pad, the at least one chip, and the first output pad are sequentially connected,
  the first input pad and the first output pad are in direct physical contact with the first surface of the substrate,
  a surface of the first input pad facing away from the substrate and a surface of the first output pad facing away from the substrate constitute a partial area of an outer surface of the electronic element,
  the electronic element is on a side of the second output pad and the second input pad facing away from the circuit board,
  the first surface of the substrate of the electronic element faces toward the circuit board,
  the first input pad of the electronic element is directly welded to the second output pad of the circuit board,
  the first output pad of the electronic element is directly welded to the second input pad of the circuit board,
  the first input pad, the at least one chip, and the first output pad are connected through the impedance matching circuit,
  a groove is defined in the circuit board opposite to the impedance matching circuit,
  the impedance matching circuit is in the groove, and
  the radiator is on the side of the electronic element facing away from the circuit board; and
  a surface of the electronic element facing away from the circuit board is attached to a surface of the radiator, or there is a gap between the surface of the electronic element facing away from the circuit board and the surface of the radiator, wherein the gap is filled with a heat conducting material.

* * * * *